US009946056B2

(12) United States Patent
Suda

(10) Patent No.: US 9,946,056 B2
(45) Date of Patent: Apr. 17, 2018

(54) ILLUMINATION OPTICAL SYSTEM, EXPOSURE APPARATUS, AND METHOD OF MANUFACTURING ARTICLE

(71) Applicant: CANON KABUSHIKI KAISHA, Tokyo (JP)

(72) Inventor: Hiromi Suda, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/064,771

(22) Filed: Mar. 9, 2016

(65) Prior Publication Data
US 2016/0266497 A1 Sep. 15, 2016

(30) Foreign Application Priority Data

Mar. 10, 2015 (JP) .................................. 2015-047413

(51) Int. Cl.
*G03B 27/54* (2006.01)
*G03B 27/72* (2006.01)
(Continued)

(52) U.S. Cl.
CPC ..... *G02B 19/0047* (2013.01); *G02B 19/0028* (2013.01); *G02B 27/0994* (2013.01);
(Continued)

(58) Field of Classification Search
CPC .............. G02B 6/0008; G02B 19/0028; G02B 19/0047; G02B 27/0994; G03F 7/70016;
(Continued)

(56) References Cited

U.S. PATENT DOCUMENTS

| 5,572,287 | A | 11/1996 | Wangler et al. |
| 6,654,101 | B2 | 11/2003 | Suzuki et al. |
| 7,001,055 | B1 * | 2/2006 | Lange ................ G02B 27/0994 356/237.2 |
| 8,334,654 | B2 | 12/2012 | Kikuchi et al. |
| 2005/0134820 | A1 * | 6/2005 | Mulder ............... G03F 7/70075 355/67 |

(Continued)

FOREIGN PATENT DOCUMENTS

| CN | 101548132 A | 9/2009 |
| EP | 0940842 A3 | 2/2000 |

(Continued)

OTHER PUBLICATIONS

Office Action Issued in Chinese Appln. No. 201610126205.3 dated Sep. 4, 2017. English translation provided.

*Primary Examiner* — Colin Kreutzer
(74) *Attorney, Agent, or Firm* — Rossi, Kimms & McDowell LLP

(57) ABSTRACT

Provided is an illumination optical system that illuminates a target illumination region by using light emitted from a discharge lamp. The system includes a condensing mirror that condenses the light from the discharge lamp, an optical integrator which has a polygonal cross-sectional shape and is arranged on an optical path from the condensing mirror to the target illumination region, an imaging optical system that forms an image on the target illumination region with respect to an exit end face of the optical integrator as an object plane, and a power supply cable connecting to an electrode of the discharge lamp across the optical path directed from the condensing mirror to the optical integrator. The cable is arranged so that a shadow of the cable is neither parallel nor perpendicular to each side of the polygon of an entrance surface of the optical integrator.

8 Claims, 3 Drawing Sheets

(51) Int. Cl.
*H01J 5/50* (2006.01)
*G02B 19/00* (2006.01)
*G02B 27/09* (2006.01)
*G03F 7/20* (2006.01)
*F21V 8/00* (2006.01)

(52) U.S. Cl.
CPC ...... *G03F 7/70016* (2013.01); *G03F 7/70075* (2013.01); *G02B 6/0008* (2013.01)

(58) Field of Classification Search
CPC .................. G03F 7/70075; G03F 7/70175; H01J 61/526; H01J 61/86
USPC ............... 313/11, 331, 623, 639; 355/67, 71
See application file for complete search history.

(56) References Cited

U.S. PATENT DOCUMENTS

2008/0273186 A1* 11/2008 Brotsack ............ G03F 7/70075
 355/67
2010/0118287 A1* 5/2010 Kikuchi .................... H01J 5/54
 355/69

FOREIGN PATENT DOCUMENTS

| | | |
|---|---|---|
| JP | 07201730 A | 8/1995 |
| JP | 2002025898 A | 1/2002 |
| JP | 2004095286 A | 3/2004 |
| JP | 2008262911 A | 10/2008 |

* cited by examiner

CROSS-SECTIONAL VIEW
TAKEN ALONG LINE A - A

LIGHT INTENSITY
DISTRIBUTION

LIGHT INTENSITY
DISTRIBUTION

CROSS-SECTIONAL VIEW
TAKEN ALONG LINE A - A

LIGHT INTENSITY
DISTRIBUTION

LIGHT INTENSITY
DISTRIBUTION

ILLUMINATION OPTICAL SYSTEM, EXPOSURE APPARATUS, AND METHOD OF MANUFACTURING ARTICLE

BACKGROUND OF THE INVENTION

Field of the Invention

The present invention relates to an illumination optical system, an exposure apparatus, and a method of manufacturing an article.

Description of the Related Art

In a photolithography technique that forms a fine pattern on a substrate by projecting a pattern formed on a mask onto a substrate to which a photosensitive material has been applied, the mask needs to be illuminated at a uniform illumination. In contrast, for example, there is known a technique that improves illumination uniformity by arranging an internal reflection optical integrator between a light source and a target illumination surface. Note that the internal reflection optical integrator can be a glass rod or a hollow pipe and is also called an optical pipe. These terms will be used interchangeably in this specification.

For example, Japanese Patent Laid-Open No. 7-201730 discloses a method that improves the illumination uniformity of a target illumination surface by arranging an exit end face of an optical pipe in a conjugate position with a reticle surface. Japanese Patent Laid-Open No. 2002-025898 discloses a technique that can effectively propagate light from a light source unit to a target illumination surface when the angular distribution (effective light source distribution) of the light to be condensed on the target illumination surface has an annular shape. However, in this illumination system, the shadow from an electrode wire included in the light source unit such as a discharge lamp or the cooling nozzle for suppressing heat emission of the light source unit are reflected on the effective light source when the light is condensed by the ellipsoid mirror. The loss of light amount caused by this can be a factor that avoids improving the productivity of an exposure apparatus.

On the other hand, Japanese Patent Laid-Open No. 2008-262911 discloses an arrangement which tries to prevent, as much as possible, the loss of light amount by integrating a cooling nozzle and a power supply cable of a light source unit.

Although the arrangement disclosed in Japanese Patent Laid-Open No. 2008-262911 has an arrangement in which the cooling nozzle and the power supply cable of a light source unit are integrated and can reduce the loss of light amount, a shadow that falls on the exposure light has an adverse effect on the effective light source distribution, and it becomes impossible to ignore its effect on imaging performance. Note that "the effective light source distribution" refers to a light intensity distribution on a pupil plane of an illumination optical system that illuminates a mask. Assume that, for example, the shadow of the integrated power supply cable and cooling nozzle falls on the exposure light and this appears on the effective light source distribution. Consider a case when a repetitive same-width pattern is arranged, on a mask, in a direction horizontal (X direction) to a predetermined direction of the shadow and in a direction vertical (Y direction) to the predetermined direction of the shadow. In this case, if the mask is illuminated with illumination light having the effective light source distribution affected by the above shadow, a difference between the X-direction line width and the Y-direction line width of the projected pattern is generated. This is because the transfer efficiency of diffracted light which holds pattern information changes depending on the direction.

In this manner, if the effective light source distribution is affected by the shadow of the power supply cable or the cooling nozzle, good imaging performance may be impossible depending on the direction of the pattern.

SUMMARY OF THE INVENTION

The present invention provides, for example, a technique advantageous in reducing the effect on imaging performance when a shadow of a light source unit member is projected on an exposure light.

According to one aspect of the present invention, an illumination optical system that illuminates a target illumination region by using light emitted from a discharge lamp is provided. The apparatus comprises a condensing mirror configured to condense the light emitted from the discharge lamp, an internal reflection optical integrator which has a polygonal cross-sectional shape and is arranged on an optical path from the condensing mirror to the target illumination region, an imaging optical system configured to form an image on the target illumination region with respect to an exit end face of the internal reflection optical integrator as an object plane, and a power supply cable connecting to an electrode of the discharge lamp across an optical path directed from the condensing mirror to the optical integrator. The power supply cable is arranged so that a shadow of the power supply cable is neither parallel nor perpendicular to each side of the polygon of an entrance surface of the optical integrator.

Further features of the present invention will become apparent from the following description of exemplary embodiments (with reference to the attached drawings).

DESCRIPTION OF THE EMBODIMENTS

Various exemplary embodiments, features, and aspects of the invention will be described in detail below with reference to the drawings.

Embodiments of the present invention will now be described in detail with reference to the accompanying drawings. It should be noted that the present invention is not limited to the following embodiments, and the embodiments are merely detailed examples advantageous in implementing the present invention. In addition, not all the combinations of features described in the following embodiments are necessarily essential to the solving means of the present invention.

Figure 1:
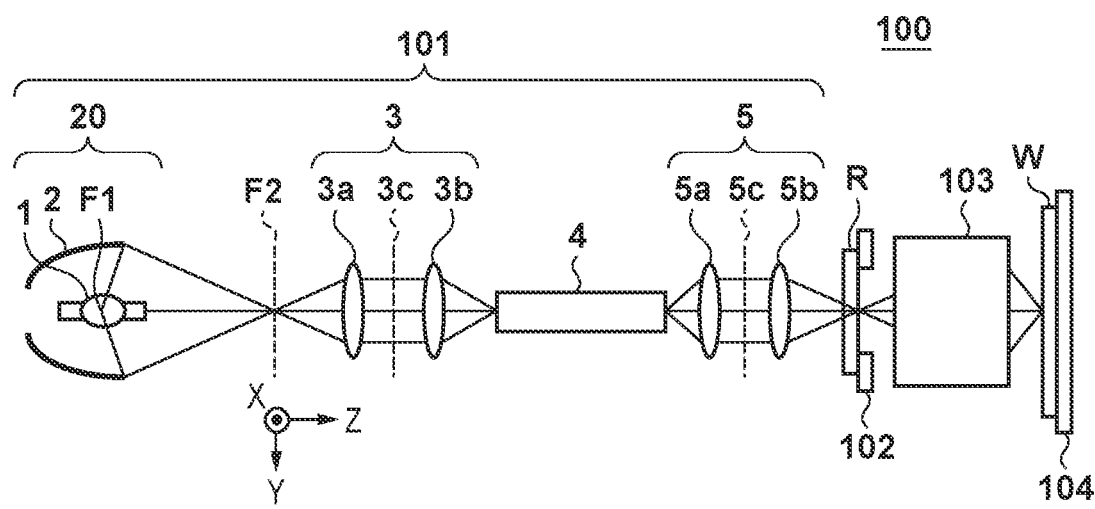
FIG. 1 is a view showing the arrangement of an exposure apparatus according to an embodiment.

FIG. 1 is a schematic view showing the arrangement of an exposure apparatus 100 which includes an illumination optical system 101. The exposure apparatus 100 is an apparatus used in, for example, the lithography process of a manufacturing process of a semiconductor device and is a projection exposure apparatus that exposes (transfers) a pattern image formed on a reticle R (mask) onto a wafer W (substrate) by a scanning exposure method. Note that, in FIG. 1 and the subsequent drawings, the Z-axis is taken along a normal direction of the wafer W, and the X- and Y-axes are taken in directions perpendicular to each other in a plane parallel to the surface of the wafer W. The exposure apparatus 100 includes the illumination optical system 101, a reticle stage 102, a projection optical system 103, and a wafer stage 104.

In the illumination optical system 101, light (light beam) from a light source unit 20 is adjusted to illuminate the reticle R which is the target illumination region. The reticle R is, for example, an original made from silica glass on which a pattern (for example, a circuit pattern) to be transferred on the wafer W is formed. The reticle stage 102 is configured to be movable in each direction of the X- and Y-axes while holding the reticle R. The projection optical system 103 projects, at a predetermined magnification, the light that passed through the reticle R on the wafer W. The wafer W is a substrate made from, for example, single-crystal silicon on which a resist (photosensitive material) has been applied. The wafer stage 104 holds the wafer W by a wafer chuck (not shown) and is configured to be movable in each direction of the X-, Y-, and Z-axes (may include ωx, ωy, and ωz which are the respective rotational directions of the axes in some cases).

The illumination optical system 101 includes the light source unit 20, a first relay lens 3, an optical integrator 4, and a second relay lens 5. The light source unit 20 includes a discharge lamp 1 and an ellipsoid mirror 2 which is a condensing mirror. As the discharge lamp 1, for example, an extra high pressure mercury lamp which supplies light such as i-line (365 nm wavelength) or the like can be adopted. Further, when the illumination optical system 101 and the projection optical system 103 are formed from a catadioptric system or a catoptric system, an electron source which supplies X-rays or a charged particle beam such as an electron beam can be adopted. The ellipsoid mirror 2 condenses light (light beam) emitted from the discharge lamp 1 at a second focal point F2. The light generating unit in the bulb of the discharge lamp 1 is arranged, for example, near a first focal point F1 of the ellipsoid mirror 2. The first relay lens 3 is an imaging optical system, and the second focal point F2 and the entrance end face of the optical integrator 4 are optically conjugate by a front lens group 3a and a rear lens group 3b.

The optical integrator 4 is arranged in the middle of an optical path from the ellipsoid mirror 2 to the reticle R as the target illumination region. The optical integrator 4 is an internal reflection optical system which makes the light intensity distribution of the exit end face uniform by reflecting a light beam that entered from the entrance end face a plurality of times with its internal surface. In this embodiment, the entire shape of the optical integrator 4 is a polygonal prism. In this embodiment, the entire shape of the optical integrator 4 is a square prism and is an optical rod whose cross-sectional shape is a rectangle. Each side of the rectangle is arranged to be parallel to the X-axis or Y-axis. Note that the optical integrator 4 is not limited to an optical rod and may be, for example, a hollow rod (pipe) with reflective surfaces formed inside as long as it can act in the same manner as the optical rod. The shape of the entrance end face and the exit end face (both in an X-Y plane) of the optical integrator 4 is not limited to a rectangle and may be another polygon. When light enters the optical integrator 4, the exit end face is uniformly illuminated through the effect of internal reflection.

The second relay lens 5 is an imaging optical system, and the exit end face of the optical integrator 4 and the reticle R are optically conjugate by a front lens group 5a and a rear lens group 5b. The second relay lens 5 forms an image on the reticle R with respect to the exit end face of the optical integrator 4 as the object plane. Note that in order to avoid transferring a foreign material on the exit end face of the optical integrator 4, the conjugate position can be slightly shifted. In this case, the shape of the illuminating region which illuminates the reticle R will be a rectangle, but it can be another shape. Subsequently, the light emitted from the reticle R, that is, the image of the pattern, is transferred on the wafer W via the projection optical system 103.

The arrangement of the light source 20 will be described in detail with reference to FIG. 2. The discharge lamp 1 includes electrodes in a bayonet cap portion. More specifically, the discharge lamp 1 includes an anode 22A and a cathode 22B in the bayonet cap portion. An anode cable 21A and a cathode cable 21B as power supply cables are connected to the anode 22A and the cathode 22B, respectively. The anode cable 21A is connected to the anode 22A across the optical path directed from the ellipsoid mirror 2 to the optical integrator 4.

By applying an extra high voltage to the discharge lamp 1, the discharge lamp 1 emits light and heat simultaneously. Particularly, the anode 22A and the cathode 22B emit a considerable amount of heat. In order to prevent the temperature from rising in this portion, it is structured so that the discharge lamp 1 can maintain a desired temperature by blowing compressed air for cooling from an anode cooling nozzle 23A and a cathode cooling nozzle 23B onto the anode 22A and the cathode 22B. In the same manner as the anode cable 21A, the anode nozzle 23A also is connected to the anode 22A across the optical path directed from the ellipsoid mirror 2 to the optical integrator 4.

Figure 2:
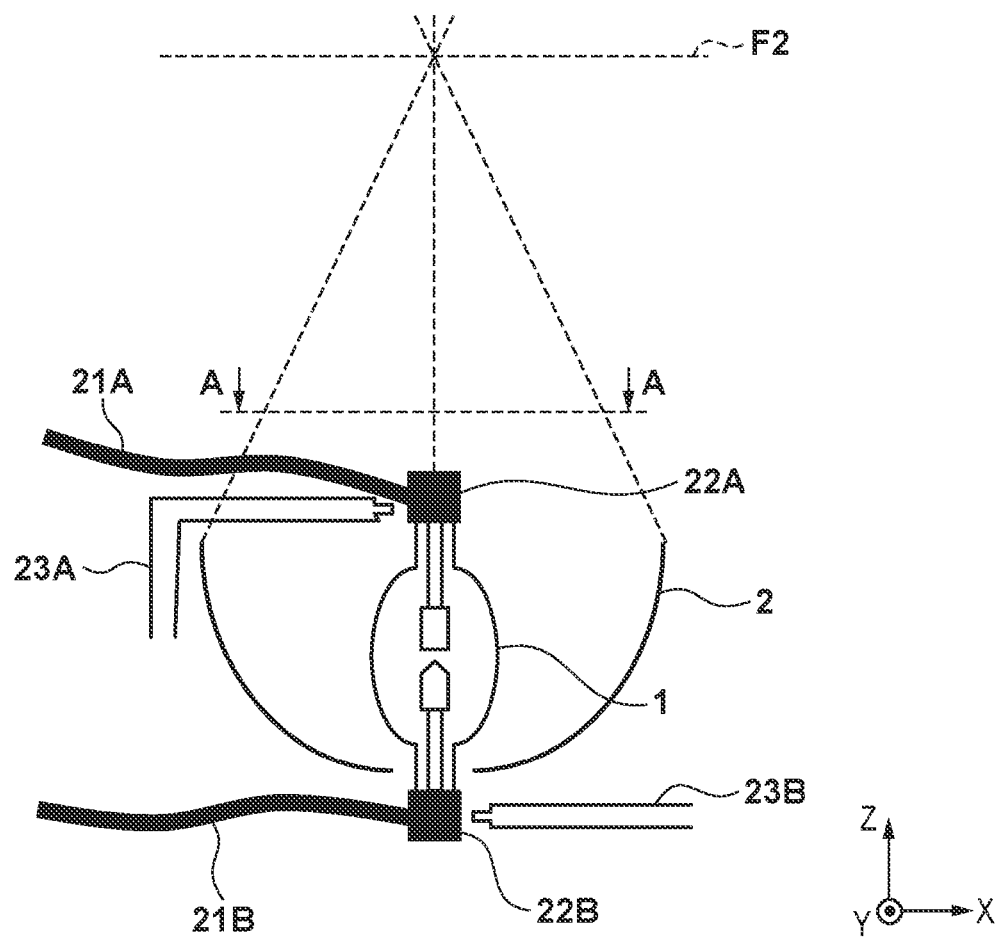
FIG. 2 is a view showing the arrangement of a light source unit according to the embodiment.
Figure 3:
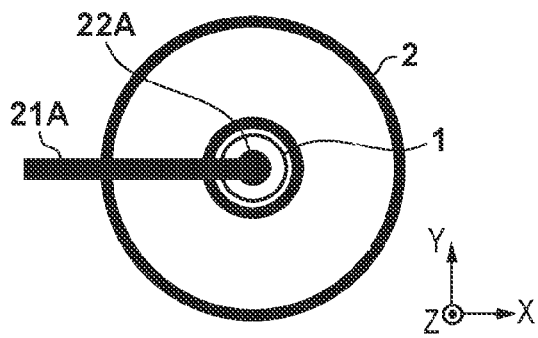
FIG. 3 is a cross-sectional view taken along a line A-A in FIG. 2 showing an example of the arrangement of an anode cable according to a related art.

FIG. 3 is a cross-sectional view taken along a line A-A in FIG. 2 and shows the perspective from the side of the second focal point F2. The light emitted from the discharge lamp 1 heads to the second focal point F2 after being reflected by the ellipsoid mirror 2. At this time, part of the light is blocked by the anode cable 21A and the anode cooling nozzle 23A midway through the optical path. In the embodiment, the anode cable 21A and the anode cooling cable 23A are arranged to overlap in the cross-sectional view, of the optical integrator, that intersects with the optical path from the condensing mirror to the target illumination region.

Here, the width of the anode cable 21A is wider than that of the anode cooling nozzle 23A. Hence, the anode cooling nozzle 23A is hidden by the anode cable 21A in FIG. 3. The anode cable 21A and the anode cooling nozzle 23A are arranged so as to extend in parallel to the X-axis.

Figure 4:
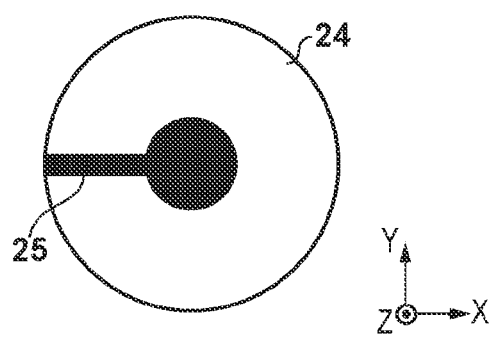
FIG. 4 is a schematic view of the light intensity distribution on a pupil plane of a first relay lens according to the related art.

The light beam from the second focal point F2 passes through the front lens group 3a of the first relay lens 3 and forms a light intensity distribution on a pupil plane 3c as shown in FIG. 4. For the sake of descriptive convenience, the energy of a region 24 in FIG. 4 is at 100% and the energy of a region 25 blocked by the anode cable 21A is at 0%.

Figure 5:
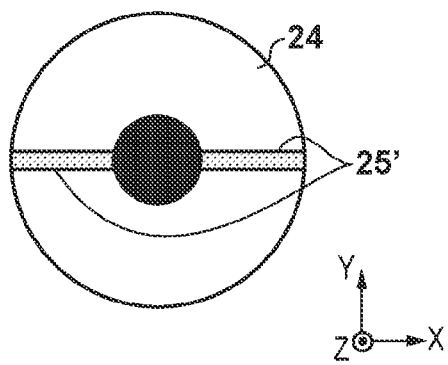
FIG. 5 is a schematic view of the light intensity distribution on a pupil plane of a second relay lens according to the related art.

The light beam having a light intensity distribution as in FIG. 4 passes through the rear lens group 3b of the first relay lens 3 and enters the optical integrator 4. Due to the characteristics, even if the angular distribution of the light beam to the optical integrator 4 is asymmetrical with respect to the X-axis or Y-axis, the angular distribution of the emitted light beam changes to a symmetrical angular distribution with respect to the X- and Y-axes by internal reflection of the light beam repeated a number of times in the optical integrator. Consequently, the light beam emitted from the exit end face of the optical integrator 4 has a light intensity distribution with a dark portion caused by inverting and copying the image of the region 25, blocked by the anode cable 21A, with respect to the X-axis. Thus, the effective light source distribution formed on a pupil plane 5c of the second relay lens 5 (eventually the pupil planes of the illumination optical system 101) become as that shown in FIG. 5. The effective light source distribution in FIG. 5 has an annular shape distribution in which the energy of the region blocked by the anode cable and a region 25' which includes its inverted region with respect to the X-axis is reduced to 50% of the energy of the region 24. In this case, the effective light source distribution cannot obtain a good imaging performance due to unevenness in shape and intensity occurring in the X and Y directions.

Figure 11:
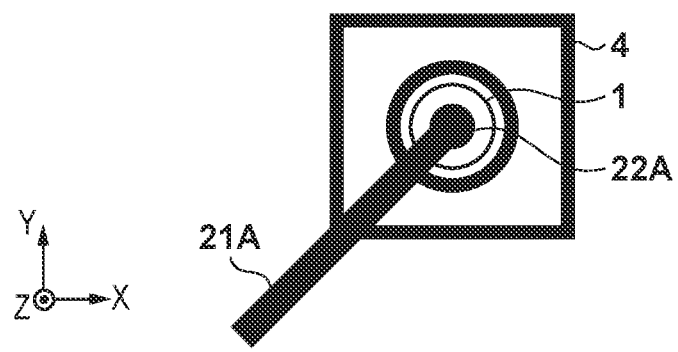
FIG. 11 is a view showing an example of the arrangement of a power supply cable in a cross-sectional view of an optical integrator.

The embodiment improves this feature of the related art. In the related art of FIG. 3, the anode cable 21A (and the anode cooling nozzle 23A) is arranged so as to extend in parallel to the X-axis. In contrast, in the embodiment, the anode cable 21A is arranged so as to extend in a direction neither parallel nor perpendicular to the X and Y directions, as shown in the cross-sectional view taken along a line A-A in FIG. 2 of FIG. 6. In other words, the anode cable 21A is arranged so the shadow of the anode cable 21A is neither parallel nor perpendicular to each side of the rectangular cross-section of the optical integrator 4 on the entrance surface of the optical integrator 4 (in a cross-sectional view of the optical path) as shown in FIG. 11. Additionally, in the embodiment, the anode cooling nozzle 23A is also arranged on the entrance surface of the optical integrator 4 so that the shadow of the anode cooling nozzle 23A overlaps with the shadow of the anode cable 21A.

Figure 7:
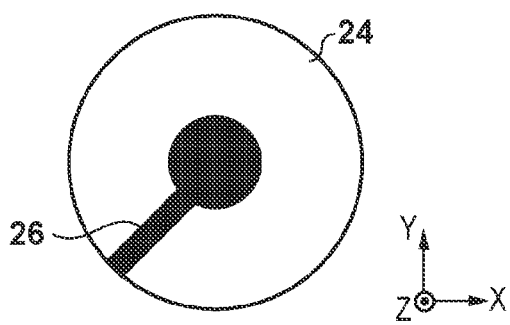
FIG. 7 is a schematic view of the light intensity distribution on a pupil plane of a first relay lens according to the embodiment.
Figure 8:
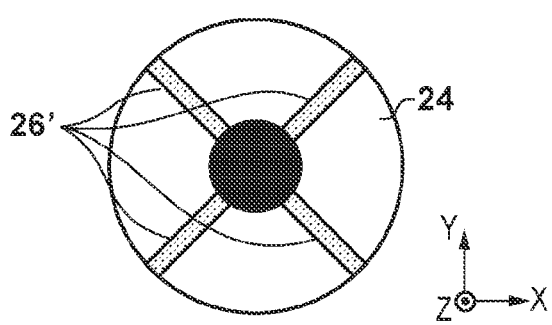
FIG. 8 is a schematic view of the light intensity distribution on a pupil plane of a second relay lens according to the embodiment.

In this case, the pupil plane 3c of the first relay lens has a light intensity distribution in which the energy of a region 26 blocked by the anode cable is 0% of that of the region 24, as shown in FIG. 7. In this case, from the effect of the optical integrator 4, the pupil plane 5c of the second relay lens has an effective light source distribution with a dark portion in a region 26' including a region blocked by the anode cable 21A and its inverted region with respect to the X- and Y-axes, as in FIG. 8. Therefore, the effective light source distribution becomes a symmetrical distribution with respect to the X- and Y-axes. The energy of the region 26' becomes 75% of that of the region 24 and the unevenness of intensity is reduced.

The arrangement direction of the anode cable 21A in the X-Y plane is, for example, 45° with respect to each side of the rectangle that is the cross-sectional shape of the optical integrator 4. Hence, since the dark portion can be dispersed for each 90° rotation, the difference in the balance of intensity in the X and Y directions of the effective light source distribution can be minimized.

Figure 9:
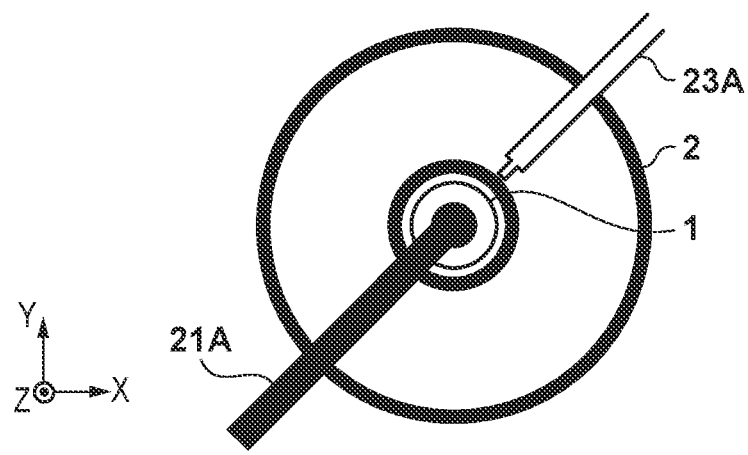
FIG. 9 is a view showing a modification of FIG. 6.
Figure 10:
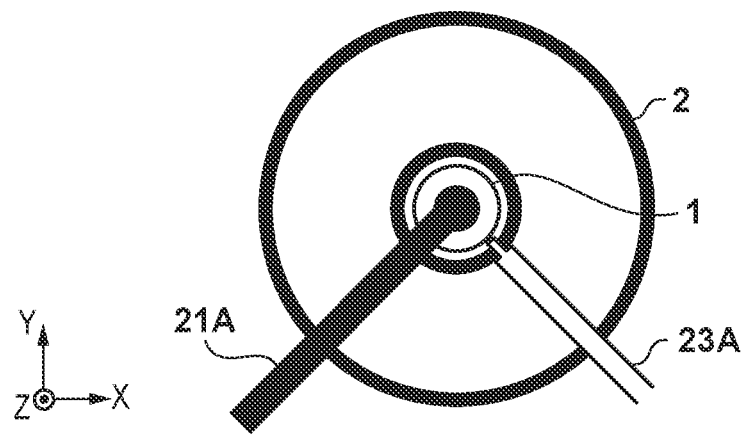
FIG. 10 is a view showing a modification of FIG. 6.

Note that although the anode cable 21A and the anode cooling nozzle 23A were arranged at the same angle in the above example, this may be difficult in some cases due to device limitations. In such a case, the anode cable 21A and the anode cooling nozzle 23A can be arranged so that the angle made by the shadows of both components is 180°, as shown in FIG. 9. Alternatively, as shown in FIG. 10, they can be arranged so that the angle made by the shadows of both components is 90°. In either cases of FIG. 9 and FIG. 10, the effective light source distribution is the same as that of FIG. 8, and the dark portion can be equally dispersed every 90° and the difference in the balance of the intensity in the X and Y directions can be minimized.

Figure 6:
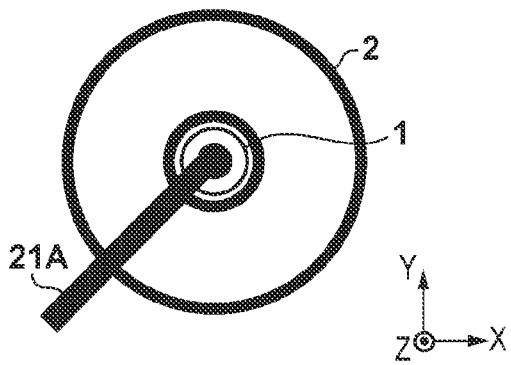
FIG. 6 is a cross-sectional view taken along the line A-A in FIG. 2 showing an example of the arrangement of an anode cable according to the embodiment.

In addition, the embodiment can be implemented in accordance with the example of FIG. 6 even in the case of a light source unit formed by an integrated anode cooling nozzle and anode cable as in Japanese Patent Laid-Open No. 2008-262911.

In each example above, an optical rod having a rectangular cross-sectional shape was used as the optical integrator 4. However, the present invention is not limited to this. For example, an optical rod having a hexagonal cross-sectional shape or a hollow rod can be used. Even in a case where the cross-sectional shape is a hexagon, the anode cable 21A and the anode cooling nozzle 23A can be arranged in the same manner so as to set their shadows to be neither parallel nor perpendicular to each side of the hexagon. As a result, an effective light source distribution with smaller unevenness of shape and intensity can be obtained than when the shadows are arranged to be parallel or perpendicular to each side of the hexagon.

<Embodiment of Article Manufacturing Method>

An article manufacturing method according to an embodiment of the present invention is suitable to manufacture an article, for example, a microdevice such as a semiconductor device or an element having a microstructure. The article manufacturing method according to this embodiment includes a step of forming a latent image pattern on a photoresist applied to a substrate using the above-described exposure apparatus, and a step of developing the substrate with the latent image pattern formed in the step. The manufacturing method further includes other known steps (oxidation, deposition, vapor deposition, doping, planarization, etching, resist removal, dicing, bonding, and packaging). The article manufacturing method according to this embodiment is superior to a conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-047413, filed Mar. 10, 2015, which is hereby incorporated by reference herein in its entirety.

What is claimed is:

1. An illumination optical system that illuminates a target illumination region by using light emitted from a discharge lamp, comprising:
a condensing mirror configured to condense the light emitted from the discharge lamp;
an internal reflection optical integrator which has a polygonal cross-sectional shape and is arranged on an optical path from the condensing mirror to the target illumination region;
an imaging optical system configured to form an image on the target illumination region, the imaging optical system having an object plane at an exit end plane of the internal reflection optical integrator;
a power supply cable connected to an electrode of the discharge lamp so as to cross an optical path directed from the condensing mirror to the internal reflection optical integrator, and
a cooling nozzle configured to cool the discharge lamp, wherein the power supply cable is arranged so that a shadow of the power supply cable is neither parallel nor perpendicular to each side of the polygon of an entrance plane of the internal reflection optical integrator, and
wherein the cooling nozzle is arranged so that a shadow of the cooling nozzle is at least one of 90° and 180° with respect to the shadow of the power supply cable on the entrance plane of the internal reflection optical integrator.

2. An exposure apparatus comprising:
an illumination optical system configured to illuminate a mask by using light emitted from a discharge lamp; and
a projection optical system configured to project an image of a pattern of the illuminated mask on a substrate,
wherein the illumination optical system includes:
a condensing mirror configured to condense the light emitted from the discharge lamp;
an internal reflection optical integrator configured to have an internal reflection surface of a rectangular cross-sectional shape and reflect light from the condensing mirror by the internal reflection surface;
a first imaging optical system configured to cause a plane including a focal point where the condensing mirror condenses light from the discharge lamp and an entrance plane of the internal reflection optical integrator to have an optically conjugated relation;
a second imaging optical system configured to form an image, on the mask as an image plane, of a whole area of an exit end plane of the internal reflection optical integrator as an object plane; and
a power supply cable connected to an electrode of the discharge lamp so as to cross an optical path directed from the condensing mirror to the internal reflection optical integrator,
wherein the power supply cable and the internal reflection optical integrator are configured to have a fixed relationship between an orientation of the power supply cable and an orientation of the internal reflection optical integrator so that a shadow of the power supply cable on the entrance plane of the internal reflection optical integrator is neither parallel nor perpendicular to respective sides of the rectangular cross-sectional shape.

3. An exposure apparatus comprising:
an illumination optical system configured to illuminate a mask using light emitted from a discharge lamp; and
a projection optical system configured to project an image of a pattern of the illuminated mask on a substrate,
wherein the illumination optical system includes:
a condensing mirror configured to condense the light emitted from the discharge lamp;
an internal reflection optical integrator configured to have an internal reflection surface of a rectangular cross-sectional shape and reflect light from the condensing mirror by the internal reflection surface;
a first imaging optical system configured to cause a plane including a focal point where the condensing mirror condenses light from the discharge lamp and an entrance plane of the internal reflection optical integrator to have an optically conjugated relation;
a second imaging optical system configured to form an image, on the mask as an image plane, of a whole area of an exit end plane of the internal reflection optical integrator as an object plane; and
a cooling nozzle configured to cool the discharge lamp and arranged so as to cross an optical path directed from the condensing mirror to the internal reflection optical integrator,
wherein the cooling nozzle and the internal reflection optical integrator are configured to have a fixed relationship between an orientation of the cooling nozzle and an orientation of the internal reflection optical integrator so that a shadow of the cooling nozzle on the entrance plane of the internal reflection optical integrator is neither parallel nor perpendicular to respective sides of the rectangular cross-sectional shape.

4. A method of manufacturing an article, comprising:
exposing a substrate by using an exposure apparatus; and
developing the exposed substrate,
wherein the exposure apparatus includes:
an illumination optical system configured to illuminate a mask by using light emitted from a discharge lamp; and
a projection optical system configured to project an image of a pattern of the illuminated mask on the substrate,
wherein the illumination optical system includes:
a condensing mirror configured to condense the light emitted from the discharge lamp;
an internal reflection optical integrator configured to have an internal reflection surface of a rectangular cross-sectional shape and reflect light from the condensing mirror by the internal reflection surface;
a first imaging optical system configured to cause a plane including a focal point where the condensing mirror condenses light from the discharge lamp and an entrance plane of the internal reflection optical integrator to have an optically conjugated relation;
a second imaging optical system configured to form an image, on the mask as an image plane, of a whole area of an exit end plane of the internal reflection optical integrator as an object plane; and
a power supply cable connected to an electrode of the discharge lamp so as to cross an optical path directed from the condensing mirror to the internal reflection optical integrator,
wherein the power supply cable and the internal reflection optical integrator are configured to have a fixed relationship between an orientation of the power supply cable and an orientation of the internal reflection optical integrator so that a shadow of the power supply cable on the entrance plane of the internal reflection optical integrator is neither parallel nor perpendicular to respective sides of the rectangular cross-sectional shape.

5. A method of manufacturing an article, comprising:
exposing a substrate by using an exposure apparatus; and
developing the exposed substrate,
wherein the exposure apparatus includes:
  an illumination optical system configured to illuminate a mask by using light emitted from a discharge lamp; and
  a projection optical system configured to project an image of a pattern of the illuminated mask on the substrate,
  wherein the illumination optical system includes:
    a condensing mirror configured to condense the light emitted from the discharge lamp;
    an internal reflection optical integrator configured to have an internal reflection surface of a rectangular cross-sectional shape and reflect light from the condensing mirror by the internal reflection surface;
    a first imaging optical system configured to cause a plane including a focal point where the condensing mirror condenses light from the discharge lamp and an entrance plane of the internal reflection optical integrator to have an optically conjugated relation;
    a second imaging optical system configured to form an image, on the mask as an image plane, of a whole area of an exit end plane of the internal reflection optical integrator as an object plane; and
    a cooling nozzle configured to cool the discharge lamp and arranged so as to cross an optical path directed from the condensing mirror to the internal reflection optical integrator,
    wherein the cooling nozzle and the internal reflection optical integrator are configured to have a fixed relationship between an orientation of the cooling nozzle and an orientation of the internal reflection optical integrator so that a shadow of the cooling nozzle on the entrance plane of the internal reflection optical integrator is neither parallel nor perpendicular to respective sides of the rectangular cross-sectional shape.

6. The apparatus according to claim 2, further comprising
a stage configured to hold the mask and move along a first direction and a second direction perpendicular to the first direction,
wherein the respective sides of the rectangular cross-sectional shape are parallel to the first direction and the second direction.

7. The apparatus according to claim 2, wherein the power supply cable is arranged so that the shadow of the power supply cable extends along only one direction of 45° with respect to the respective sides of the rectangular cross-sectional shape.

8. The apparatus according to claim 2, further comprising:
a cooling nozzle configured to cool the discharge lamp,
wherein a shadow of the cooling nozzle overlaps with the shadow of the power supply cable on the entrance plane of the internal reflection optical integrator.

* * * * *